(12) United States Patent
Pan et al.

(10) Patent No.: US 6,511,883 B1
(45) Date of Patent: Jan. 28, 2003

(54) METHOD OF FABRICATING MOS SENSOR

(75) Inventors: Jui-Hsiang Pan, Hsinchu (TW); Chih-Hua Lee, Taoyuan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/348,428

(22) Filed: Jul. 7, 1999

(51) Int. Cl.⁷ .............................................. H01L 21/336
(52) U.S. Cl. ...................... 438/268; 438/142; 438/270; 438/272; 438/589
(58) Field of Search ................................. 438/268, 142, 438/270, 272, 589

(56) References Cited

U.S. PATENT DOCUMENTS

| | | | | |
|---|---|---|---|---|
| 4,646,427 A | * | 3/1987 | Doyle ........................ | 29/586 |
| 5,960,270 A | * | 9/1999 | Misra et al. ................. | 438/197 |
| 6,001,677 A | * | 12/1999 | Shimizu ....................... | 438/231 |
| 6,077,744 A | * | 6/2000 | Hao et al. .................... | 438/268 |
| 6,153,455 A | * | 11/2000 | Ling et al. .................. | 438/231 |
| 6,211,023 B1 | * | 4/2001 | Yeh et al. .................... | 438/299 |

* cited by examiner

*Primary Examiner*—Vu A. Le
*Assistant Examiner*—Pho M. Luu

(57) ABSTRACT

A method of fabricating a MOS sensor is described. A P-doped region extending into a substrate is formed. A stacked polysilicon structure is formed over the P-doped region. Ions are implanted into the substrate to form an N-doped region extending shallowly into the P-doped region, the stacked polysilicon structure serving as an implantation buffer layer. The stacked polysilicon structure are patterned and etched to form a stacked polysilicon ring over the N-doped region. A metal line is formed for electrically connecting the stacked polysilicon ring with a gate of a MOS transistor.

12 Claims, 4 Drawing Sheets

METHOD OF FABRICATING MOS SENSOR

BACKGROUND OF THE INVENTION

1. Field of Invention

The present invention relates to a method of fabricating a sensor. More particularly, the present invention relates to a method for electrically connecting a photo-diode with a MOS gate.

2. Description of Related Art

Charge coupled devices (CCDs) are often employed in digital sensors for image extraction. Applications thereof include close-circuit TVs, cameras, and video recorders. However, CCDs are quite costly to produce and bulky. Hence, in order to reduce volume, energy consumption and cost, CMOS photo-diodes that can be formed by semiconductor techniques are a major future substitute for CCDs.

A sensor often comprises a circuit area, and a photo-sensitivity area composed of a photo-diode. The photo-diode is a light-sensitive (or light-detecting) semiconductor device that converts light energy into electrical signal through a P-N junction. Due to the existence of an internal electric field at the P-N junction, electrons in the N-doped region and holes in the P-doped region cannot diffuse across the P-N junction when no light shines on the junction. However, when a light beam of sufficient intensity impinges upon the junction region, electron-hole pairs are generated within the junction region. These electron-hole pairs, while reaching the region with an internal electric field, separate from each other. The electrons migrate towards the N-doped region while the holes migrate towards the P-doped region, thereby leading to a current flowing in the P-N junction electrodes. Ideally, the photo-diode should be in open-circuit condition having no electric current flowing when the device is in the dark.

Conventionally, the signal is transmitted from the photo-sensitivity area to the circuit area through only a metal line connecting with the P-N photo-diode. A junction between the metal line and the P-N photo-diode has a very low potential barrier. If a dark current exists in the P-N photo-diode, it flows through the junction barrier to the metal line easily, and becomes a noise signal causing data misjudgment,

SUMMARY OF THE INVENTION

The present invention provides a method of fabricating a MOS sensor. A P-doped region extending into a substrate is formed. A stacked polysilicon structure is formed over the P-doped region. Ions are implanted into the P-doped region to form an N-doped region extending into the substrate by using the stacked polysilicon structure as an implantation buffer layer. The stacked polysilicon structure is patterned and etched to form a stacked polysilicon ring over the N-doped region. A metal line is formed for electrically connecting the stacked polysilicon ring with a gate of a MOS transistor.

Preferably, the stacked polysilicon structure is formed by the steps of depositing a first polysilcon film over the P-doped region and then depositing a second polysilicon film over the first polysilicon film. Before the second polysilicon film is deposited, the first polysilicon film can be patterned and etched to form at least a window exposing the P-doped region. After this window formation, the second polysilicon film can be deposited to cover the first polysilicon film and to make contact with the P-doped region through the window.

The stacked polysilicon structure serves as an implantation buffer layer that protects the substrate from being damaged in the implantation step. Moreover, by electrically connecting the photodiode with the MOS gate through a stacked polysilicon ring and a metal line, the value of the dark current read out from the photo-diode is reduced when the MOS sensor is operated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 1A–1I are schematic, cross-sectional views of a method of fabricating a MOS sensor according to one preferred embodiment of this invention.

Figure 1A:
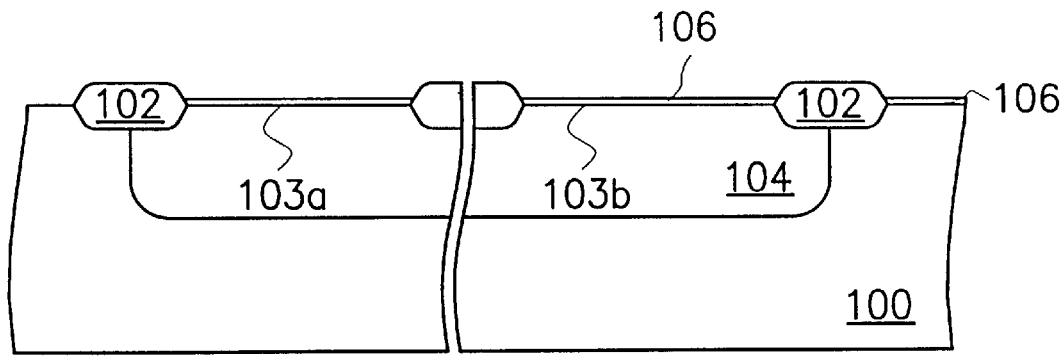
FIGS. 1A–1I are schematic, cross-sectional views of a method of fabricating a MOS sensor according to one preferred embodiment of this invention.

As shown in FIG. 1A, a substrate 100, such as a P-type doped silicon substrate is provided. A twin well process is performed to create a P-well and an N-well extending substantially deeply into the substrate 100, wherein the P-well is shown and represented by reference numeral 104, and wherein the N-well is not shown in FIG. 1A. A photo-sensitivity unit cell, comprising a photo-sensitivity area and a circuit area, will be formed in and on the P-well.

Several field isolation regions 102, such as field oxide regions, are formed in edge of the P-well 104 on the substrate 100. The field oxide regions 102 can be formed by means of a thermal oxidation process. The field isolation regions 102 expose a first active region 103a under which a photo-sensitivity area will be formed, and a second active region 103b on which a transistor will be formed. The second active region with the transistor thereon also serves as a circuit area.

A sacrificial oxide layer 106 is formed over the first and the second active regions 103a and 103b. The sacrificial oxide layer 106 can be formed using a thermal oxidation technique or a deposition technique.

Figure 1B:
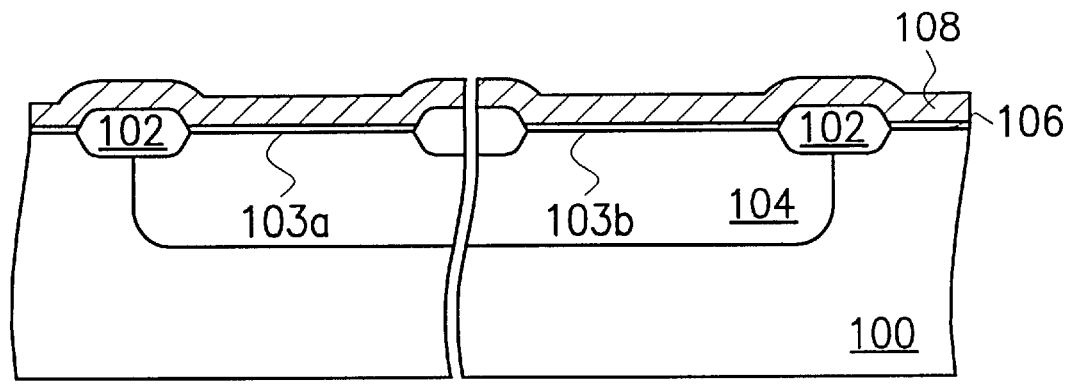

As shown in FIG. 1B, a first polysilicon film 108 is formed over the substrate 100. The first polysilicon film 108 can be formed using a chemical vapor deposition technique.

Figure 1C:
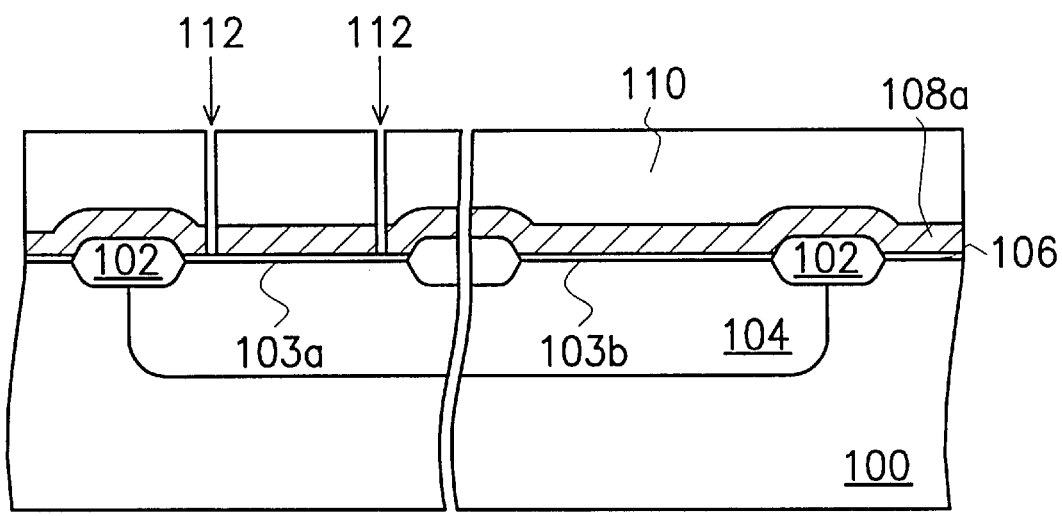

As shown in FIG. 1C, a photoresist pattern 110 is formed over the first polysilicon film 108 (shown in FIG. 1B). Following exposure and development of the first photoresist pattern 110, the first polysilicon film 108 is then etched to form several windows 112 exposing the sacrificial oxide layer 106 over the first active region 103a. The etching can be performed by means of a dry-etch process using the first photoresist pattern 110 as an etching mask. The etched first polysilicon film is represented by reference numeral 108a.

Figure 1D:
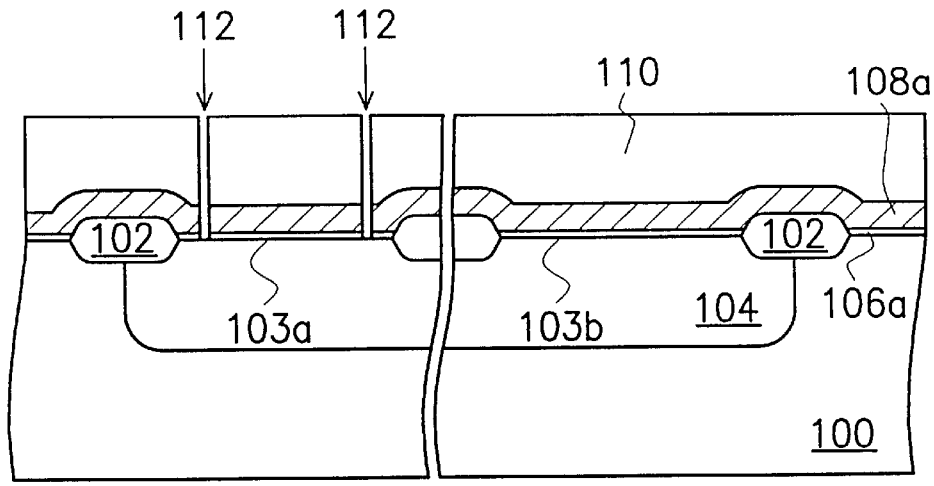

As shown in FIG. 1D, the sacrificial oxide layer 106 (shown in FIG. 1C) exposed by the windows 112 are removed by cleaning the bottom of the windows. The cleaning can be performed by means of a wet-etch technique. The remaining sacrificial oxide layer is represented by reference numeral 106a.

Figure 1E:
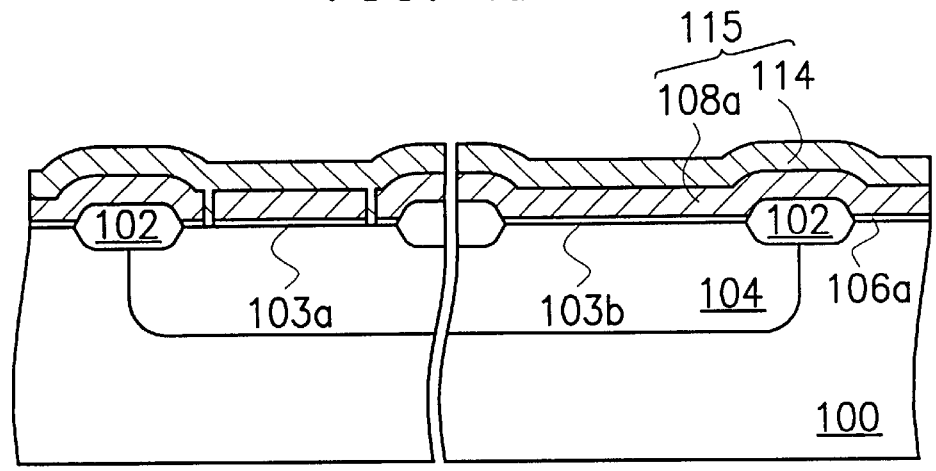

As shown in FIG. 1E, after the first photoresist pattern 110 (shown in FIG. 1D) is removed, a second polysilicon film 114 is deposited over the first polysilicon film 108a and makes contact with the substrate 100 wherever the windows 112 (shown in FIG. 1D) have been created in the first polysilicon film 108a. The first and the second polysilicon films 108a and 114 serve as a stacked polysilicon structure 115.

Figure 1F:
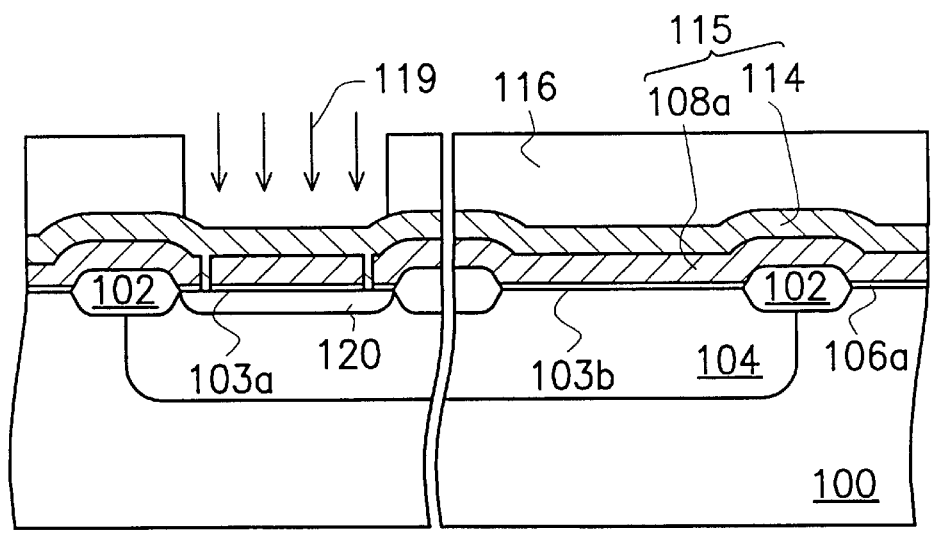

As shown in FIG. 1F, an N-doped region 120 extending substantially shallowly within the P-well 104 is formed at the first active region 103a. The N-doped region 120 and the P-well 104 serve as a P-N photo-diode. The doped region 120 can be formed by the steps of first forming a second photoresist pattern 116 over the second polysilicon film 114 over the first active region 103a, and then implanting phosphorous ions into the substrate 100 by using the second photoresist pattern 116 as a mask. In this implantation step, the stacked polysilicon structure 115 serves as an implantation buffer layer that protects the substrate 100 from being damaged. Arrows 119 represents the implantation direction.

Figure 1G:
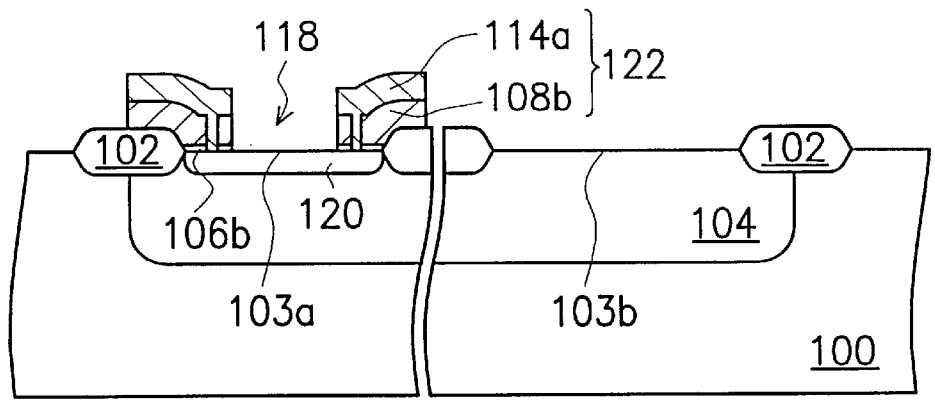

As shown in FIG. 1G, after the second photoresist pattern 116 (shown in FIG. 1F) is removed, the stacked polysilicon structure 115 (shown in FIG. 1F) is patterned and etched to form a stacked polysilicon ring 122 over the first active region 103a. The stacked polysilicon ring 122, comprising the etched first polysilicon film 108b and the etched second polysilicon film 114a, encompasses an opening 118 partially exposing the N-doped region 120. The stacked polysilicon structure 115 can be patterned with a photoresist pattern (not shown), and can be etched to form the stacked polysilicon ring 122, wherein the photoresist pattern as an etching mask. The photoresist pattern is removed after this etching step.

Figure 1H:
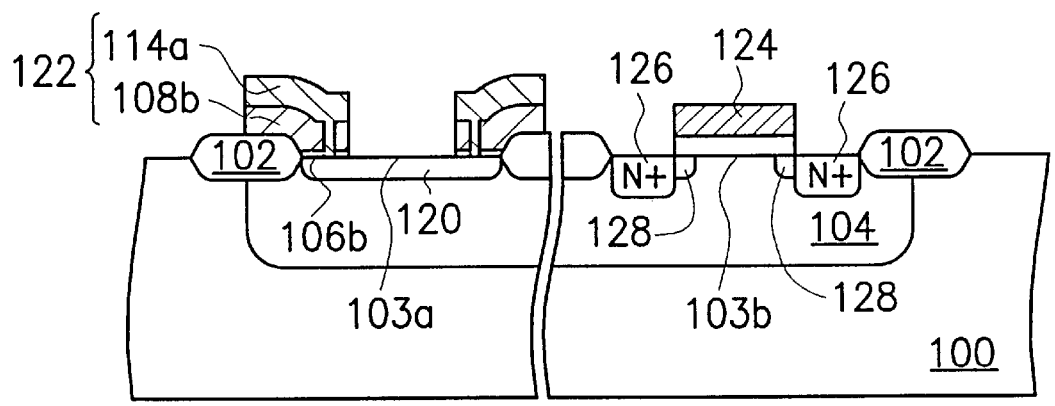

As shown in FIG. 1H, a transistor is formed on the second active region 103b. The transistor, which can be a CMOS transistor, comprises the elements of a gate 124, a source/drain region 126, and a LDD region 128.

Figure 1I:
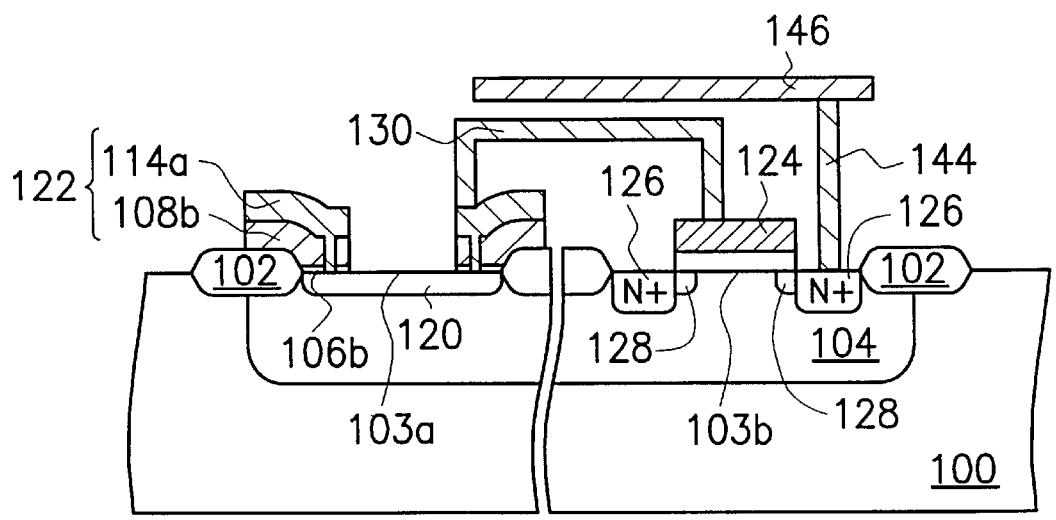

Following the formation of the transistor, a metal-interconnection process is performed. As shown in FIG. 1I, the metal-interconnection process comprises steps of, for example, electrically connecting the gate 124 with stacked polysilicon ring 122 by a metal line 130, forming a tungsten plug 144 on the source/drain region 126, and forming a light-shielding metal 146 over the tungsten plug 144.

Figure 2:
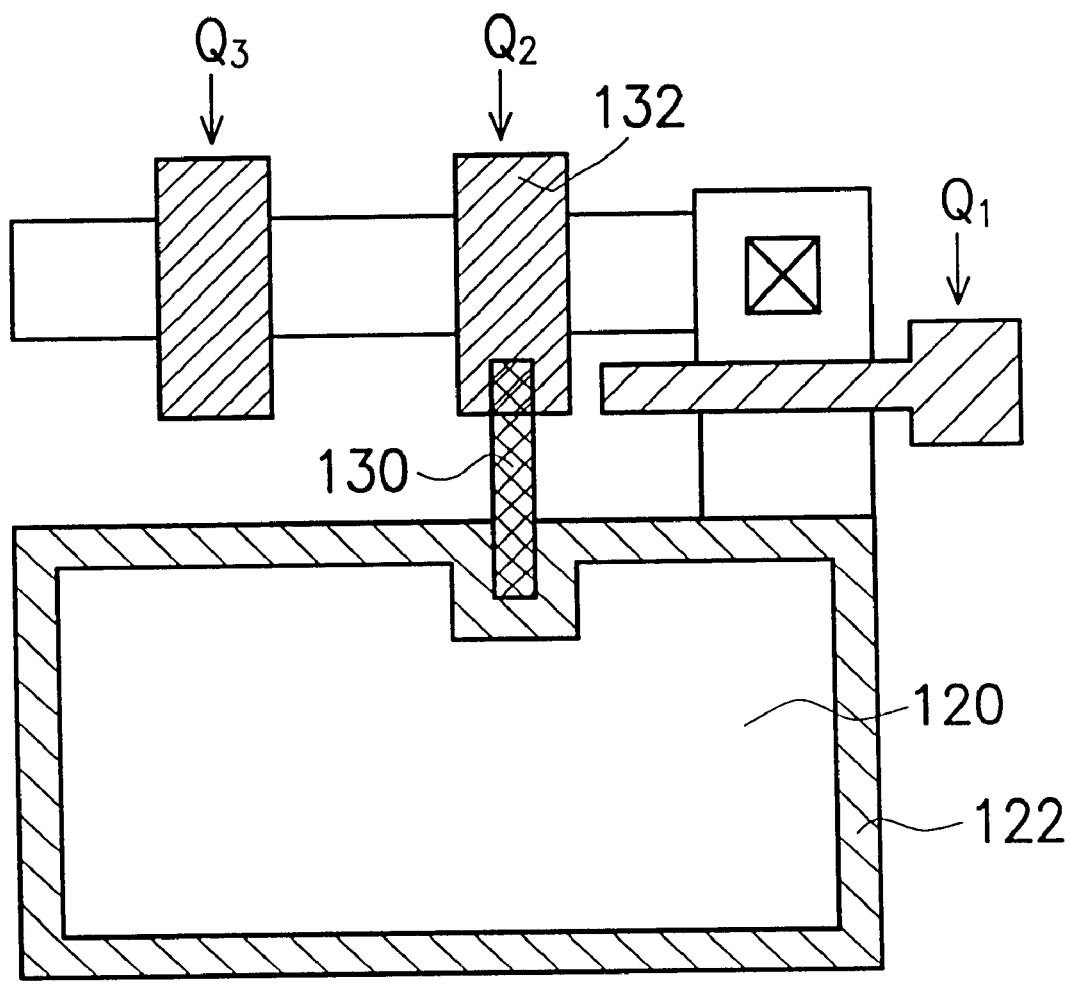
FIG. 2 is a schematic, top view of the MOS sensor according to the preferred embodiment of this invention.

FIG. 2 is a schematic, top view of the MOS sensor according to the preferred embodiment of this invention. As shown in FIG. 2, the transistor $Q_2$ is located on the circuit area 103b comprising further transistors $Q_1$ and $Q_3$. The metal line 130 is formed as the connection between the stacked polysilicon ring 122 and the gate. 132 of the transistor $Q_2$.

In this present invention, the photo-diode is electrically connected with the MOS gate through a stacked polysilicon ring and a metal line, rather than through only a metal line. A diffusion barrier is formed due to dopant segregation between the stacked polysilicon ring and the substrate. When the MOS sensor is operated, the diffusion barrier lowers the intensity of a dark current transmitted from the photo-diode to the MOS gate, thereby reducing the value of the dark current read out from the photo-diode. This reduction increases the on/off ratio of the MOS sensor, and therefore increases the contrast ratio of the MOS sensor. In other words, the MOS sensor has an improved sensitivity in this present invention.

The above described versions of the present invention have many advantages comprising:

1. By using the stacked polysilicon structure as an implantation buffer layer, the substrate is protected from being damaged in the implantation step.
2. By electrically connecting the photo-diode with the MOS gate through a stacked polysilicon ring and a metal line, the value of the dark current read out from the photo-diode is reduced when the MOS sensor is operated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a CMOS sensor wherein the CMOS sensor comprises a diode and a NMOS transistor, the method comprising:

forming an isolation region in a substrate to form a diode region and a NMOS region;

forming a P-well extending into the substrate;

forming a stacked polysilicon structure over the substrate and the isolation region;

forming a mask layer having an opening thereon on the stacked polysilicon structure;

implanting ions into the P-well to form an N-doped region in the diode region extending shallowly into the substrate, the stacked polysilicon structure serving as an implantation buffer layer;

removing the mask layer;

patterning and etching the stacked polysilicon structure to form a stacked polysilicon ring surrounding the N-doped region partially covering the isolation region and edges of the N-doped region adjacent to the isolation region;

forming the NMOS transistor on the NMOS region; and forming a metal line for electrically connecting the stacked polysilicon ring with a gate of the NMOS transistor.

2. The method of claim 1, wherein the stacked polysilicon structure is formed by the steps of:

depositing an oxide layer over the substrate;

depositing a first polysilicon film over the oxide layer; and depositing a second polysilicon film over the first polysilicon film.

3. The method of claim 2, further comprising the steps of patterning and etching the first polysilicon film and the oxide layer to form at least a window exposing the P-doped region before depositing the second polysilicon film.

4. The method of claim 3, wherein the second polysilicon film is deposited to cover the first polysilicon film and to make contact with the P-doped region through the window.

5. A method for electrically connecting a silicon photo-diode with a MOS gate, the method comprising:

forming a stacked polysilicon ring and a metal line between the silicon photo-diode and the MOS gate.

6. The method of claim 5, wherein the silicon photo-diode has a P-doped region and an N-doped region over the P-doped region.

7. The method of claim 6, wherein the stacked polysilicon ring is formed over the N-doped region.

8. The method of claim 6, wherein the N-doped region is formed by the steps of:

depositing a first polysilcon film over the P-doped region;

depositing a second polysilicon film over the first polysilicon film; and implanting ions into the P-doped region to form the N-doped region extending shallowly into the P-doped region, the first and the second polysilicon films serving as an implantation buffer layer.

9. The method of claim 8, further comprising the steps of patterning and etching the first polysilicon film to form at least a window exposing the P-doped region before depositing the second polysilicon film.

10. The method of claim 9, wherein the second polysilicon film is deposited to cover the first polysilicon film and to make contact with the P-doped region through the window.

11. The method of claim 8, wherein the stacked polysilicon ring is formed by the steps of patterning and etching the first and the second polysilicon films to create the stacked polysilicon ring.

12. A method of fabricating a CMOS sensor, wherein the CMOS sensor comprises a diode and a MOS transistor, the method comprising:

forming an isolation region in a substrate to form a diode region and a MOS region;

forming the diode in the diode region;

forming a stacked polysilicon ring surrounding the diode partially covering the isolation region and a edge of the diode adjacent to the isolation region;

forming the MOS transistor on the MOS region; and forming a metal line for electrically connecting the stacked polysilicon ring with a gate of the MOS transistor.

* * * * *